United States Patent [19]

Oomura et al.

[11] 4,334,311
[45] Jun. 8, 1982

[54] TRANSVERSE JUNCTION STRIPE SEMICONDUCTOR LASER DEVICE

[75] Inventors: Etsuji Oomura; Toshio Murotani; Makoto Ishii, all of Itami, Japan

[73] Assignee: Mitsubishi Denki Kabushiki Kaisha, Tokyo, Japan

[21] Appl. No.: 149,313

[22] Filed: May 13, 1980

[51] Int. Cl.³ .............................................. H01S 3/19
[52] U.S. Cl. ...................................... 372/47; 357/17
[58] Field of Search .................... 331/94.5 H; 357/17, 357/18

[56] References Cited

U.S. PATENT DOCUMENTS 4,183,038 1/1980 Namizaki et al. ...................... 357/17

FOREIGN PATENT DOCUMENTS 55-29162 3/1980 Japan ............................ 331/94.5 H

OTHER PUBLICATIONS

Kumabe et al., "High Temperature Single Mode CW Operation with a TJS Laser Using a Semi-Insulating GaAs Substrate", Proceedings of the 10th Conference on Solid State Devices, Tokyo, 1978, *Japanese Journal of Applied Physics*, vol. 18 (1979) Supplement 18-1, pp. 371–375.

*Primary Examiner*—James W. Davie
*Attorney, Agent, or Firm*—Wenderoth, Lind & Ponack

[57] ABSTRACT

A p type GaAlAs layer is disposed on an n type substrate and then n type GaAlAs, GaAs and GaAlAs layers are successively grown on the p type GaAlAs layer. Zn is diffused into predetermined portions of those n type layers to a depth reaching the GaAlAs layer to form pn junctions between the original n type regions of the layers and their regions converted to the p form the n type conductivity. The pn junction formed in the GaAs layer serves as a light emitting region.

19 Claims, 8 Drawing Figures

TRANSVERSE JUNCTION STRIPE SEMICONDUCTOR LASER DEVICE

BACKGROUND OF THE INVENTION

This invention relates to a semiconductor laser device having a low threshold current and also small in temperature dependency thereof.

It is well known that several structures of semiconductor lasers have been produced in which the threshold current is decreased. Among them a laser structure known as the so-called transverse junction stripe (abbreviated to "TJS") laser is particularly excellent. Such a TJS laser oscillates in the single mode and the characteristics thereof are described in detail, for example, in an H. Namizaki article entitled "Transverse-Junction-Stripe Lasers with a GaAs p-n Homojunction," IEEE Journal of Quantum Electronics, QE-11, Nov. 8, 1975, pages 427–431. However, the TJS laser has been disadvantageous in that a leakage current, not contributing to the laser oscillation, increases with a temperatures rise. This increase in leakage current causes a rapid increase in threshold current until the laser oscillation is ceased due to the heat generated therein.

Accordingly, it is an object of the present invention to provide a new and improved semiconductor laser device enabled to oscillate continuously even at temperatures which are somewhat higher than room temperature by minimizing the leakage current thereof.

SUMMARY OF THE INVENTION

The present invention provides a semiconductor laser device comprising a semiconductor substrate, a first layer formed of a selected one of a semiconductive material of a first type conductivity and an electrically insulating material and disposed on the semiconductor substrate, a second semiconductor layer of a second type conductivity formed on the first layer, a third semiconductor layer of the second type conductivity formed on the second semiconductor layer, a fourth semiconductor layer of the second type conductivity formed on the third semiconductor layer, and a special semiconductor region having the first type conductivity changed from the second type conductivity and occupying predetermined regions of at least the second, third and fourth semiconductor layers, the special semiconductor region forming pn junctions with the second, third and fourth semiconductor layers, the third semiconductor layer being narrower in its forbidden bandwidth than the second and fourth semiconductor layers, and including the pn junction serving as a light emitting region.

BRIEF DESCRIPTION OF THE DRAWINGS

The present invention will become more readily apparent from the following detailed description taken in conjunction with the accompanying drawings in which.

Throughout the drawing figures like reference numerals designate the identical or corresponding components.

DESCRIPTION OF THE PREFERRED EMBODIMENTS

For a better understanding of the present invention, the description will now be made in conjunction with FIG. 1 wherein there is illustrated the fundamental structure of conventional semiconductor laser devices such as the TJS lasers described above. The illustrated arrangement comprises an n type gallium arsenide (GaAs) substrate 10, and an n type gallium-aluminum arsenide (GaAlAs) layer 12, an n type gallium arsenide (GaAs) layer 14 and an n type gallium-aluminum arsenide (GaAlAs) layer 16 successively formed on one of the main faces of the n type semiconductor substrate according to a liquid epitaxial growth technique.

Figure 1:
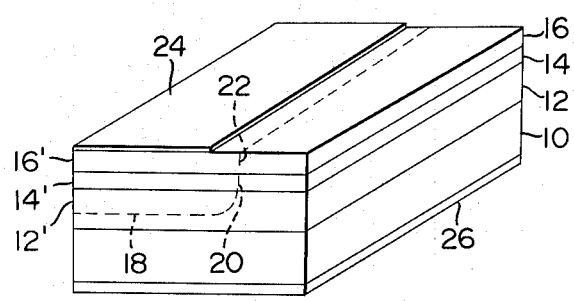
FIG. 1 is a perspective view of a conventional semiconductor laser device.

A p type conductivity imparting impurity such as zinc (Zn) is then diffused into predetermined portions, in this case, the lefthand portions as viewed in FIG. 1, of the n type layers 16, 14 and 12 according to the selective diffusion technique to convert those predetermined layer portions to a p type conductivity to thereby form a p type GaAlAs layer 16', a p type GaAl layer 14', and a p type GaAlAs layer 12', superposed on one another. The n type layer 12 includes a portion which is located beneath the p type layer 12' and has its conductivity type remaining unchanged. The p type layers 12', 14' and 16' and the n type layers 12, 14 and 16 form respective pn junctions 18, 20 and 22 therebetween. Those pn junctions are continuous to one another.

Following this, a first electrode 24 is disposed in ohmic contact with the p type GaAlAs layer 16' and a second electrode 26 is disposed in ohmic contact with the other main face of the n type substrate 10 resulting in the completed device.

Gallium arsenide (GaAs) is narrower in its forbidden band-width than gallium-aluminum arsenide (GaAlAs) and therefore a pn junction with gallium arsenide can be rendered less in diffusion potential than a pn junction with gallium-aluminum arsenide. As a result, the application of a forward voltage across the electrodes 24 and 26 permits a great portion of the resulting current to be concentrated on the pn junction 20 between the GaAs layers 14' and 14 to thereby cause a laser oscillation in a carrier injected region adjacent to that pn junction.

However, although it could be said that the diffusion potential is high at the pn junction with gallium-aluminum arsenide, a current would flow over the barrier formed by that pn junction, though the current would be low. The density of a current flowing through the junction with gallium arsenide will now be compared with the density of a current flowing through a junction with gallium aluminum arsenide. Assuming that the gallium-aluminum arsenide ($Ga_{1-x}Al_xAs$) includes aluminum in a concentration x of 0.4, densities of currents flowing through the pn junctions with gallium arsenide and gallium-aluminum arsenide respectively have the ratio of about 1000 to 1 at room temperature.

On the other hand, the pn junction 20 with gallium arsenide has typically an area of $0.5 \times 300$ $\mu m^2$ while the pn junctions 18 and 22 with gallium-aluminum arsenide have typically a total area of about $50 \times 300$ $\mu m^2$. Since the current is equal to the current density multiplied by the area, currents flowing through the pn junctions 18 and 22 with gallium-aluminum arsenide amount to about 10% of the total current. Of course, this current does not contribute to the laser oscillation.

As the temperature rises, the ratio of current density is further increased so that the current flowing through the pn junctions with gallium-aluminum arsenide is increased resulting in an abrupt increase in leakage current. Accordingly, a threshold current $I_t$ for laser oscillation is abruptly increased substantially following $I_t \propto T^7$ where T designates an absolute temperature. Eventually, the laser oscillation is ceased due to the generation of heat. In this connection, the threshold current $I_t$ may have the temperature dependency expressed by $I_t \propto T^3$ provided that the leakage current is equal to zero.

Figure 2:
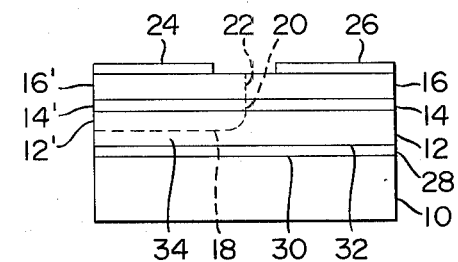
FIG. 2 is a cross sectional view of one embodiment according to the semiconductor laser device of the present invention.

Referring now to FIG. 2, there is illustrated one embodiment according to the semiconductor laser device of the present invention. The arrangement illustrated comprises a conventional n type gallium arsenide (GaAs) substrate 10 and a p type gallium arsenide (GaAs) layer 28 disposed on one of the main faces of the substrate 10 to form a pn junction 30 therebetween.

As in the arrangement of FIG. 1, a liquid epitaxial growth technique or the like is used to grow an n type gallium-aluminum arsenide (GaAlAs) layer 12 on the p type layer 28 to form a pn heterojunction 32 therebetween, and then to grow an n type gallium arsenide (GaAs) layer 14 on the n type layer 12. Finally, an n type gallium-aluminum arsenide (GaAlAs) layer 16 is epitaxially grown on the n type layer 14.

As in the arrangement of FIG. 1, a p type conductivity imparting impurity such as zinc (Zn) is selectively diffused into a semiconductor chip formed as described above from a predetermined portion, in this case, the lefthand portion as viewed in FIG. 2 of the exposed surface of the gallium-aluminum arsenide layer 16 to convert diffused portions of the chip to a p type conductivity. As shown in FIG. 2, a diffusion front reaches the n type gallium arsenide layer 12. In the resulting structure a p type layer 16' is formed in the n type layer 16 to form a pn junction 22 therebetween, a p type layer 14' is formed in the n type layer 14 to form a pn junction therebetween and a p type layer 12' is formed in the n type layer 12 to form a pn junction 18 therebetween and also to form a narrow channel region 34 between the p type layer 12' and the p type gallium arsenide layer 28. The pn junctions 18, 20 and 22 are continuous to one another.

A pair of first and second electrode 24 and 26 are then disposed in ohmic contact with the p and n type gallium-aluminum layers 16' and 16 respectively by a vacuum evaporation or electroplating technique. In this way, the semiconductor laser device of the present invention has been completed.

In the arrangement of FIG. 2, a leakage current tends to flow through the pn junction 18 formed between the p and n type gallium-aluminum layers 12' and 12 respectively but the same current is also forced to flow through the narrow channel region 34. A series resistance presented before this leakage current becomes high because the channel region 30 is narrow in width and therefore, the leakage current is considerably decreased. Actually, the leakage current is decreased to about one fiftieth the conventional magnitude.

In order to effectively increase the series resistance presented before the leakage current, the n type gallium-aluminum arsenide layer 12 has preferably an impurity concentration of not greater than $5 \times 10^{17}$ atoms per cubic centimeter while the zinc diffusion front approaches to its position spaced away from the p type gallium arsenide layer 28 by a distance of a few $\mu m$. The figure specified above of the impurity concentration is obtained with the gallium-aluminum arsenide layer not doped with an impurity.

By increasing the series resistance to the leakage current as described above, a current flowing through the arrangement of FIG. 2 is effectively concentrated in the pn junction 20 with gallium arsenide. Therefore, the threshold current is reduced and a rate of change thereof due to a temperature rise is also decreased. Consequently, the resulting characteristics become good so that the threshold current $I_t$ varies according to the relationship $I_t \propto T^3$ up to a temperature approximating 200° C. where T designates an absolute temperature.

Figure 3:
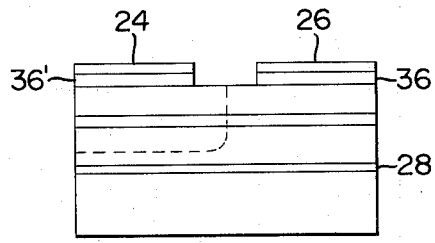
FIG. 3 is a view similar to FIG. 2 but illustrating a modification of the present invention.

FIG. 3 shows a modification of the present invention. When an electrode is disposed in ohmic contact with the grown gallium-aluminum arsenide layer 16, the contact resistance developed therebetween becomes high. In order to avoid this objection, that grown layer is, in many cases, provided with a gallium arsenide layer 36. Thereafter, the diffusion of a p type conductivity imparting impurity is effected in the manner as described above in conjunction with FIG. 2. Therefore, a pn junction is formed in the gallium arsenide layer 32.

If it is attempted to apply the present invention directly to such a structure, then a leakage current can flow through the pn junction formed in the gallium arsenide layer 36. In order to prevent this flow of leakage current, that portion of the gallium arsenide layer 36 not overlaid with the electrodes 24 and 26 is etched away.

The resulting structure is shown in FIG. 3.

Figure 4:
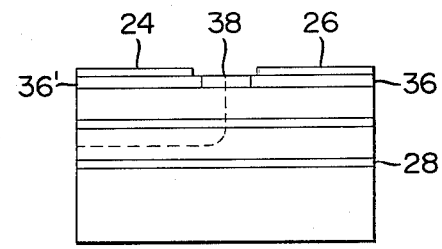
FIG. 4 is a view similar to FIG. 2 but illustrating a modification of the arrangement shown in FIG. 3.

FIG. 4 shows a modification of the arrangement shown in FIG. 3. In FIG. 4, the implantation of protons is substituted for the etching to form a high resistance region 34 in that portion of the gallium arsenide layer 38 not overlaid with the electrodes 24 and 26.

While the present invention has been illustrated and described in conjunction with the p type gallium arsenide layer 28 disposed, as a first semiconductor layer, on the n type gallium arsenide substrate 10, it is to be understood that the first semiconductor layer may comprise either a p type gallium-aluminum arsenide layer or an electrically insulating layer as will readily be understood from the foregoing.

Also, if desired, the substrate 10 may be formed of intrinsic gallium arsenide. In the latter case, the substrates 10 forms an ni junction with the p type layer 28.

Figure 5:
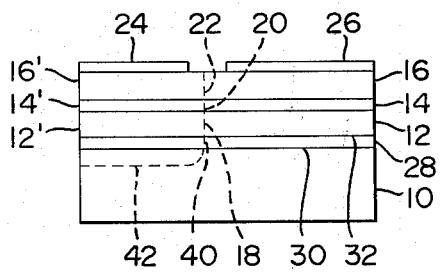
FIG. 5 is a view similar to FIG. 2 but illustrating another modification of the present invention.

The arrangement illustrated in FIG. 5 is different from that shown in FIG. 2 only in that in FIG. 5, the diffusion front reaches the substrate 10 to form a pn junction 40 in the gallium-aluminum arsenide layer 28 and a pn junction 42 in the substrate 10. The pn junction 40 includes one end connected to the pn junction 18 and the other end merged into the pn junction 42.

When a voltage is applied across the electrodes 24 and 26 so that the electrode 24 is positive with respect to the electrode 26, the pn junction 42 is forwardly biased while the pn heterojunction 30 is reversely biased. Therefore, a current scarcely flows through the pn junction 30.

Also the pn junction 32 is forwardly biased but higher in diffusion potential than the pn junction 20. Furthermore, the gallium-aluminum arsenide layer 28 can be about 1 μm thick and light doped to, for example, an impurity concentration of about $3 \times 10^{17}$ atoms per cubic centimeter to form a high resistivity layer whereby a current flowing through the pn junction 32 can be sufficiently low. The area of the pn junction 20 can be typically equal to one fiftieth the conventional magnitude.

Accordingly, the current is concentrated in the pn junction 20 and the leakage current can have a substantially negligible magnitude. Therefore the threshold current is reduced and a rate of change thereof due to a temperature arise is also decreased. Consequently, the resulting characteristics become good so that the threshold current $I_t$ varies according to the relationship $I_t \propto T^3$ up to a temperature approximating 200° C.

Figure 6:
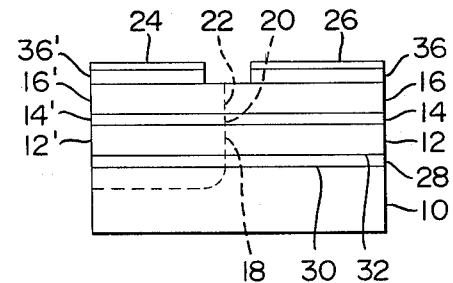
FIG. 6 is a view similar to FIG. 2 but illustrating still another modification of the present invention.

In order to avoid the objection as described above in conjunction with FIG. 3, the arrangement of FIG. 5 is modified as shown in FIG. 6. In FIG. 6, the p and n type gallium arsenide layers 36 are disposed on the uppermost gallium-aluminum arsenide layer 16 and overlaid with the electrodes 24 and 26 respectively in the same manner as described above in conjunction with FIG. 3.

Figure 7:
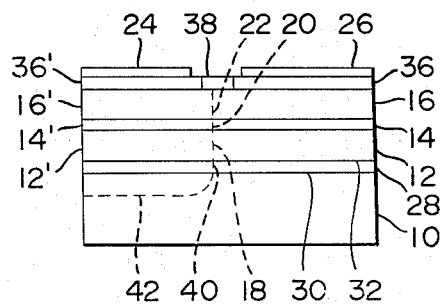
FIG. 7 is a view similar to FIG. 2 but illustrating a modification of the arrangement shown in FIG. 6.

The arrangement of FIG. 5 may be also modified as shown in FIG. 7. In FIG. 7, the implantation of protons is used to form the high resistance region 38 in the gallium arsenide layer 36 disposed on the gallium-aluminum arsenide layer 16 as described above in conjunction with FIG. 4.

Figure 8:
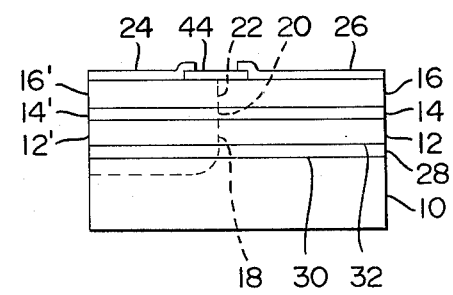
FIG. 8 is a view similar to FIG. 2 but illustrating a modification of the arrangement shown in FIG. 5.

FIG. 8 shows still another modification of the arrangement shown in FIG. 5. As shown, an electrically insulating film 44 covers that portion of the exposed surface of the gallium-aluminum arsenide layer 16 and 16' having the end of the pn junction 22 exposed thereto and adjacent to the exposed end of the pn junction 22. The insulating film 44 may be formed of silicon nitride ($Si_3N_4$) or the like. The electrodes 24 and 26 include opposite end portions overhanging the adjacent edges of the insulating film 44. The insulating film 44 serves to protect the exposed end of the pn junction 22 to improve the reliability of the resulting structure.

In summary the present invention is constructed so that the channel region with a high resistance or a barrier due to the reverse bias of the pn junction is locally provided so as to minimize the leakage current involved. Therefore, it gives the result that the continuous oscillation can be sufficiently effected at temperatures considerably higher than room temperature.

While the present invention has been illustrated and described in conjunction with several preferred embodiments thereof, it is to be understood that numerous changes and modifications may be resorted to without departing from the spirit and scope of the present invention. For example, while the present invention has been described in terms of two semiconductor materials, that is, gallium arsenide and gallium-aluminum arsenide it is to be understood that the present invention is equally applicable to two semiconductive materials other than gallium arsenide and gallium-aluminum arsenide, for example, indium phosphide (InP) and indium-gallium-arsenic phosphide (InGaAsP) and three or more semiconductive materials having different forbidden bandwidths. Also, the present invention is equally applicable to conductivity types reversed from that illustrated.

What is claimed is:

1. In a semiconductor laser device, an improved structure comprising a semiconductor substrate, a first layer formed of a selected one of a semiconductive material of a first type conductivity and an electrically insulating material and disposed on said semiconductor substrate, a second semiconductor layer of a second type conductivity formed on said first layer, a third semiconductor layer of the second type conductivity formed on said second semiconductor layer, a fourth semiconductor layer of the second type conductivity formed on said third semiconductor layer, and a special semiconductor region having the first type conductivity changed from the second type conductivity and occupying predetermined regions of at least said second, third and fourth semiconductor layers, said special semiconductor region forming pn junctions with said second, third and fourth semiconductor layers, said third semiconductor layer being narrower in its forbidden band-width than said second and fourth semiconductor layers and including the pn junction serving as a light emitting region.

2. A semiconductor laser device as claimed in claim 1, wherein said special semiconductor region having said first type conductivity is provided on the surface with a first electrode and the remaining region of at least said second, third and fourth semiconductor layers having said second type conductivity is provided on the surface with a second electrode.

3. A semiconductor laser device as claimed in claims 1 or 2, wherein said second semiconductor layer has an impurity concentration of not greater than $5 \times 10^{17}$ atoms per cubic centimeter and includes a channel region with a width of a few μm formed between said special semiconductor region and said first semiconductor layer.

4. A semiconductor laser device as claimed in claims 1 or 2, wherein said special semiconductor region of said first type conductivity occupies predetermined portions of said substrate and said first, second, third, and fourth semiconductor layers.

5. A semiconductor laser device as claimed in claim 4, wherein said first semiconductor layer is formed of a high resistivity region.

6. A semiconductor laser device as claimed in claims 1 or 2, wherein said second and fourth semiconductor layers are formed of gallium-aluminum arsenide (GaAlAs) and said third semiconductor layer is formed of gallium arsenide (GaAs).

7. A semiconductor laser device as claimed in claim 6, wherein said first layer has a thickness of 1 μm and an impurity concentration of about $3 \times 10^{17}$ atoms per cubic centimeter.

8. A semiconductor laser device as claimed in claim 7, wherein each of two electrodes is disposed in ohmic contact with a fifth semiconductor layer disposed on said fourth semiconductor layer, said fifth semiconductor layer being formed of a gallium arsenide (GaAs).

9. A semiconductor laser device as claimed in claim 8, wherein said fifth semiconductor layers overlaid with said respective electrodes are spaced away from each other by removing a portion thereof disposed at and adjacent to said pn junction formed in said fourth semiconductor layer.

10. A semiconductor laser device as claimed in claim 8, wherein said fifth semiconductor layers overlaid with said respective electrodes are connected to each other through a high resistance region disposed at and adjacent to said pn junction in said fourth semiconductor layer.

11. A semiconductor laser device as claimed in claims 1 or 2, wherein an electrically insulating layer is disposed on said fourth semiconductor layer so as to opposite to said pn junction therein.

12. A semiconductor laser device as claimed in claim 3, wherein said second and fourth semiconductor layers are formed of gallium-aluminum arsenide (GaAlAs) and said third semiconductor layer is formed of gallium arsenide (GaAs).

13. A semiconductor laser device as claimed in claim 4, wherein said second and fourth semiconductor layers are formed of gallium-aluminum arsenide (GaAlAs) and said third semiconductor layer is formed of gallium arsenide (GaAs).

14. A semiconductor laser device as claimed in claim 5, wherein said second and fourth semiconductor layers are formed of gallium-aluminum arsenide (GaAlAs) and said third semiconductor layer is formed of gallium arsenide (GaAs).

15. A semiconductor laser device as claimed in claim 3, wherein an electrically insulating layer is disposed on said fourth semiconductor layer so as to be opposite to said pn junction therein.

16. A semiconductor laser device as claimed in claim 4, wherein an electrically insulating layer is disposed on said fourth semiconductor layer so as to be opposite to said pn junction therein.

17. A semiconductor laser device as claimed in claim 5, wherein an electrically insulating layer is disposed on said fourth semiconductor layer so as to be opposite to said pn junction therein.

18. A semiconductor laser device as claimed in claim 6, wherein an electrically insulating layer is disposed on said fourth semiconductor layer so as to be opposite to said pn junction therein.

19. A semiconductor laser device as claimed in claim 7, wherein an electrically insulating layer is disposed on said fourth semiconductor layer so as to be opposite to said pn junction therein.

* * * * *